(12) United States Patent
Dutta

(10) Patent No.: US 7,915,683 B2
(45) Date of Patent: Mar. 29, 2011

(54) NANOWIRE ELECTRONIC DEVICES AND METHOD FOR PRODUCING THE SAME

(75) Inventor: Biprodas Dutta, Silver Spring, MD (US)

(73) Assignee: ZT3 Technologies, Inc., Thousand Oaks, CA (US)

( * ) Notice: Subject to any disclaimer, the term of this patent is extended or adjusted under 35 U.S.C. 154(b) by 0 days.

(21) Appl. No.: 12/801,476

(22) Filed: Jun. 10, 2010

(65) Prior Publication Data
US 2010/0270617 A1    Oct. 28, 2010

Related U.S. Application Data

(60) Division of application No. 11/837,364, filed on Aug. 10, 2007, now Pat. No. 7,767,564, which is a continuation-in-part of application No. 11/301,285, filed on Dec. 9, 2005.

(51) Int. Cl.
*H01L 21/00*    (2006.01)
(52) U.S. Cl. .................................. 257/347; 438/585
(58) Field of Classification Search .................. 257/347; 438/585
See application file for complete search history.

(56) References Cited

U.S. PATENT DOCUMENTS

| | | |
|---|---|---|
| 3,040,113 A | 6/1962 | Lindenblad |
| 3,064,063 A | 11/1962 | Imelmann |
| 3,256,584 A | 6/1966 | Parkhachev |
| 3,262,251 A | 7/1966 | Hicks |
| 3,294,504 A | 12/1966 | Hicks |
| 3,356,539 A | 12/1967 | Stachurski |
| 4,453,961 A | 6/1984 | Berkey |
| 4,578,097 A | 3/1986 | Berkey |
| 4,652,288 A | 3/1987 | Saito |
| 4,839,487 A | 6/1989 | Ito et al. |
| 4,853,020 A | 8/1989 | Sink |
| 4,963,195 A | 10/1990 | Kodato et al. |
| 5,006,671 A | 4/1991 | Boeke |
| 5,215,565 A | 6/1993 | Urano et al. |
| 5,491,452 A | 2/1996 | Ohtsubo et al. |
| 5,550,387 A | 8/1996 | Elsner et al. |
| 5,644,185 A | 7/1997 | Miller |
| 5,808,233 A | 9/1998 | Finkel et al. |
| 5,811,376 A | 9/1998 | Huang |
| 5,886,292 A | 3/1999 | Nishimoto |
| 5,900,071 A | 5/1999 | Harman |
| 6,060,656 A | 5/2000 | Dresselhaus et al. |

(Continued)

FOREIGN PATENT DOCUMENTS

JP    61-232242 A    10/1986
(Continued)

OTHER PUBLICATIONS

Badinter et al., "Cast nanowires and nanowire-based filamentary nanostructures," 2003 IEEE Conference on Electron Devices and Solid-State Circuits, Dec. 16-18, 2003, p. 35-38.

(Continued)

*Primary Examiner* — Jarrett J Stark
*Assistant Examiner* — Nicholas Tobergte
(74) *Attorney, Agent, or Firm* — The Marbury Law Group, PLLC

(57) ABSTRACT

The present invention is directed to an electrical device that comprises a first and a second fiber having a core of thermoelectric material embedded in an electrically insulating material, and a conductor. The first fiber is doped with a first type of impurity, while the second fiber is doped with a second type of impurity. A conductor is coupled to the first fiber to induce current flow between the first and second fibers.

19 Claims, 10 Drawing Sheets

U.S. PATENT DOCUMENTS

| | | | |
|---|---|---|---|
| 6,100,463 | A | 8/2000 | Ladd et al. |
| 6,112,395 | A | 9/2000 | Quick et al. |
| 6,174,352 | B1 | 1/2001 | Semerdjian et al. |
| 6,188,011 | B1 | 2/2001 | Nolas et al. |
| 6,218,724 | B1 * | 4/2001 | Ukita et al. ............ 257/538 |
| 6,231,744 | B1 | 5/2001 | Ying et al. |
| 6,274,802 | B1 | 8/2001 | Fukuda et al. |
| 6,300,150 | B1 | 10/2001 | Venkatasubramanian |
| 6,313,392 | B1 | 11/2001 | Sato et al. |
| 6,452,206 | B1 | 9/2002 | Harman et al. |
| 6,458,319 | B1 | 10/2002 | Caillat et al. |
| 6,514,453 | B2 | 2/2003 | Vigliotti et al. |
| 6,598,405 | B2 | 7/2003 | Bell |
| 6,627,809 | B1 | 9/2003 | Koga et al. |
| 6,670,539 | B2 | 12/2003 | Heremans et al. |
| 6,696,635 | B2 | 2/2004 | Prasher |
| 6,710,238 | B1 | 3/2004 | Shingu et al. |
| 6,772,611 | B2 | 8/2004 | Kliner et al. |
| 6,787,691 | B2 | 9/2004 | Fleurial et al. |
| 6,828,579 | B2 | 12/2004 | Ghamaty et al. |
| 6,858,154 | B2 | 2/2005 | Suzuki et al. |
| 6,873,638 | B2 | 3/2005 | Haase et al. |
| 6,898,357 | B2 | 5/2005 | Han et al. |
| 6,969,679 | B2 | 11/2005 | Okamura et al. |
| 6,996,147 | B2 | 2/2006 | Majumdar et al. |
| 7,064,372 | B2 | 6/2006 | Duan et al. |
| 7,115,971 | B2 | 10/2006 | Stumbo et al. |
| 7,172,661 | B1 | 2/2007 | Adar et al. |
| 7,254,151 | B2 | 8/2007 | Lieber et al. |
| 7,530,239 | B2 | 5/2009 | Dutta et al. |
| 7,559,215 | B2 | 7/2009 | Dutta et al. |
| 2002/0176815 | A1 | 11/2002 | Fleurial et al. |
| 2003/0047204 | A1 | 3/2003 | Fleurial et al. |
| 2003/0110892 | A1 | 6/2003 | Nicoloau |
| 2003/0121540 | A1 | 7/2003 | Onoue |
| 2003/0135971 | A1 | 7/2003 | Liberman et al. |
| 2004/0107988 | A1 | 6/2004 | Harman et al. |
| 2004/0112418 | A1 | 6/2004 | Yang et al. |
| 2004/0238022 | A1 | 12/2004 | Hiller et al. |
| 2004/0261829 | A1 | 12/2004 | Bell |
| 2005/0051208 | A1 | 3/2005 | Mount |
| 2005/0060884 | A1 | 3/2005 | Okamura et al. |
| 2005/0105047 | A1 | 5/2005 | Smitth, III et al. |
| 2005/0150539 | A1 | 7/2005 | Ghoshal et al. |
| 2005/0161662 | A1 | 7/2005 | Majumdar et al. |
| 2005/0252248 | A1 | 11/2005 | Kornreich et al. |
| 2006/0032526 | A1 | 2/2006 | Fukutani et al. |
| 2006/0048809 | A1 | 3/2006 | Onvural |
| 2006/0068080 | A1 | 3/2006 | Yadav et al. |
| 2006/0118158 | A1 | 6/2006 | Zhang et al. |
| 2006/0130995 | A1 | 6/2006 | Adar et al. |
| 2006/0266402 | A1 | 11/2006 | Zhang et al. |
| 2007/0084495 | A1 | 4/2007 | Dutta |
| 2007/0084499 | A1 | 4/2007 | Dutta |
| 2007/0131266 | A1 | 6/2007 | Dutta |
| 2007/0131269 | A1 | 6/2007 | Dutta |
| 2007/0245774 | A1 | 10/2007 | Dutta |
| 2008/0169016 | A1 | 7/2008 | Dutta |
| 2010/0083996 | A1 | 4/2010 | Dutta et al. |

FOREIGN PATENT DOCUMENTS

| | | |
|---|---|---|
| JP | 2004-193200 | 7/2004 |
| JP | 2005-197612 A | 7/2005 |
| JP | 2007-184566 A | 7/2007 |
| SU | 383094 | 8/1973 |
| WO | WO 98/00371 A1 | 1/1998 |
| WO | WO 00/30185 A1 | 5/2000 |

OTHER PUBLICATIONS

Campo et al., "Frequency-dependent electrical mixing law behavior in spherical particle composites," Journal of Electroceramics, 2002, 9:49-56.

Cho et al., "Fabrication and heat treatment effects on absorption characteristics of glass fibers doped with PbTe semiconductor quantum dots," Optical Fiber Communication Conference and Exhibit, 2001, OFC 2001, vol. 4, p. ThC4-1 to ThC4-3.

Donald, I.W., "Production, properties and applications of microwire and related products," Journal of Materials Science, 1987, 22:2661-2679.

Final Office Action mailed Nov. 5, 2009 in copending U.S. Appl. No. 11/301,285, 16 pages.

Ghamaty et al., "Quantum Well Thermoelectric Devices and Applications," $22^{nd}$ International Conference on Thermoelectrics, 2003, IEEE, 563-566.

Grunlan et al., "Lowering the Percolation Threshold of Conductive Composites Using Particulate Polymer Microstructure," Journal of Applied Polymer Science, 2001, 80(4):692-705.

Hicks et al., "The Effect of Quantum Well Structures on the Thermoelectric Figure of Merit," Materials Research Socitety Symposium Proceedings, 1993, 281:821-826.

Jacob et al., "Tellurite Glass Optical fiber doped with PbTe Quantum Dots," Proceeding of SPIE, vol. 5734, Apr. 2005, 124-129.

Kantser et al., "Electric Field Effect on Thermopower in Cylindrical Microwires," IEEE $22^{nd}$ International Conference on Thermoelectrics, 2003, 350-354.

Karg et al., "Novel Rapid-Thermal-Processing for CIS Thin-Film Solar Cells," Photovoltaic Specialists Conference, 1993, Conference Record of the $23^{rd}$ IEEE, May 1993, pp. 441-446.

Kempa et al., "Dielectric media based on isolated metallic nanostructures," J. Appl. Physics, 2005, 98:034310, 4 pages.

Leporda et al., "Long Glass-Coated Semimetallic and Semiconducting Wires Prepared by Two Different Liquid Phase Methods," Moldavian Journal of the Physical Sciences, 2002, 1(3):74-81.

Logvinov et al., "Upper Value of Thermoelectric Figure of Merit for Isotropic Semiconductors," $22^{nd}$ International Conference on Thermoelectrics, 2003, IEEE, La Grande-Motte, France, 452-455.

Meglei et al., "Glass-coated melt spinning fabrication technology and some physical properties of $Bi_2Te_3$ microwires," Moldavian Journal of the Physical Sciences, 2003, 2(2):277-289.

Miura et al., "Texture and thermoelectric properties of hot-extruded $Bi_2Te_3$ compound," Materials Science and Enginering, 2000, A277, 244-249.

Notice of Allowance mailed Apr. 6, 2009, in copending U.S. Appl. No. 11/777,112, 11 pages.

Petrovic et al., "Synthesis of silicon microwire," J. Mater. Res., Oct. 2001, 16(10):2777-2779.

Rogacheva et al., "Effect of Electron Concentration on the Thickness Dependences of the Thermoelectric Properties of PbTe Quantum Wells," $21^{st}$ International Conference on Thermoelectrics, 2002, IEEE, Long Beach, CA, 280-283.

Rogacheva et al., "Effect of non-stoichiometry on oxidation processes in n-type PbTe thin films," Thin Solid Films, 2003, 423(257-261).

Rogacheva et al., "Quantum size effects in IV-VI quantum wells," Physica E, 2003, 313-315.

Sun et al., "Theoretical Modeling of the Thermoelectric Figure of Merit in $Si/Si1-_xGe_x$ Quantum Well Structures," $17^{th}$ International Conference on Thermoelectrics, IEEE, 1998, Nagoya, Japan, 47-50.

Sur et al., "Thermoelectric Properties of p-type PbTe/PbEuTe Quantum Well Structures," $22^{nd}$ International Conference on Thermoelectrics, 2003, IEEE, 403-406.

Wagner et al., "Multilayer Thermoelectric Films: A Strategy for the Enhancement of ZT," The American Society of Mechanical Engineers, Orlando, Florida, IECEC Paper No. CT-320, ASME 1995, 3:87-92.

Written Opinion and International Search Report dated Feb. 23, 2009, in related PCT/US2008/009562, 7 pages.

* cited by examiner

X-ray diffraction pattern of a glass clad PbTe nano-array 1 m m 1 m m

DC resistance of a PbTe button (5.2 mm thick) prepared from the first-draw fibers at 300K DC resistance of a glass-clad PbTe button (2.78mm thick) prepared from fibers following second-draw at 300 K.

DC resistance of a PbTe button (2.09 mm) prepared from third-draw fibers at 300 K.

NANOWIRE ELECTRONIC DEVICES AND METHOD FOR PRODUCING THE SAME

This application is a Divisional of U.S. patent application Ser. No. 11/837,364, filed Aug. 10, 2007, which is a continuation-in-part of U.S. patent application Ser. No. 11/301,285, filed Dec. 9, 2005, the entire contents of which are incorporated herein by reference.

TECHNICAL FIELD

The present invention is directed to nano-wire electronic devices and methods for producing the same.

DESCRIPTION OF THE RELATED ART

Thermoelectric materials generate electricity when subjected to a thermal gradient and produce a thermal gradient when electric current is passed through them. Scientists have been trying to harness practical thermoelectricity for decades because practical thermoelectricity could, inter alia: (1) replace fluorocarbons used in existing cooling systems such as refrigerators and air conditioners; and (2) reduce harmful emissions during thermal power generation by converting some or most of the waste heat into electricity. However, the promise of practical thermoelectricity has not yet been fulfilled. One problem is that, because of its low efficiency, the industry standard in thermoelectric technology cannot be functionally integrated into everyday heating and cooling products and systems.

Bulk form thermoelectric devices such as thermoelectric generators (TEG), thermoelectric refrigerators (TER) and thermoelectric heat pumps are used for the direct conversion of heat into electricity, or for the direct conversion of electricity into heat. However, the efficiency of energy conversion and/or coefficient of performance of these bulk form thermoelectric devices are considerably lower than those of conventional reciprocating or rotary heat engines and vapor-compression systems. In view of these drawbacks and the general immaturity of the technology, bulk form thermoelectric devices have not attained immense popularity.

Early thermoelectric junctions were fashioned from two different metals or alloys capable of producing a small current when subjected to a thermal gradient. A differential voltage is created as heat is carried across the junction, thereby converting a portion of the heat into electricity. Several junctions can be connected in series to provide greater voltages, connected in parallel to provide increased current, or both. Modern thermoelectric generators can include numerous junctions in series, resulting in higher voltages. Such thermoelectric generators can be manufactured in modular form to provide for parallel connectivity to increase the amount of generated current.

In 1821, Thomas Johann Seebeck discovered the first thermoelectric effect, referred to as the Seebeck effect. Seebeck discovered that a compass needle is deflected when placed near a closed loop made of two dissimilar metals, when one of the two junctions is kept at a higher temperature than the other. This established that a voltage difference is generated when there is a temperature difference between the two junctions, wherein the voltage difference is dependent on the nature of the metals involved. The voltage (or EMF) generated per ° C. thermal gradient is known as Seebeck coefficient.

In 1833, Peltier discovered the second thermoelectric effect, known as the Peltier effect. Peltier found that temperature changes occur at a junction of dissimilar metals, whenever an electrical current is caused to flow through the junction. Heat is either absorbed or released at a junction depending on the direction of the current flow.

Sir William Thomson, later known as Lord Kelvin, discovered a third thermoelectric effect called the Thomson effect, which relates to the heating or cooling of a single homogeneous current-carrying conductor subjected to a temperature gradient. Lord Kelvin also established four equations (the Kelvin relations) correlating the Seebeck, Peltier and Thomson coefficients. In 1911, Altenkirch suggested using the principles of thermoelectricity for the direct conversion of heat into electricity, or vice versa. He created a theory of thermoelectricity for power generation and cooling, wherein the Seebeck coefficient (thermo-power) was required to be as high as possible for best performance. The theory also required that the electrical conductivity to be as high as possible, coupled with a minimal thermal conductivity.

Altenkirch established a criterion to determine the thermopower conversion efficiency of a material, which he named the power factor (PF). The latter is represented by the equation: $PF=S^2 *\sigma=S^2/\rho$, where S is the Seebeck coefficient or thermo-power, $\sigma$ is the electrical conductivity and $\rho$ ($1/\sigma$) is the electrical resistivity. Altenkirch was thereby led to establish the equation: $Z=S^2 *\sigma/k=S^2/\rho *k=PF/k$, wherein Z is the thermoelectric figure of merit having the dimensions of $K-1$. The equation can be rendered dimensionless by multiplying it by the absolute temperature, T, at which the measurements for S, $\rho$ and k are conducted such that the dimensionless thermoelectric figure of merit or ZT factor equals $(S^2 *\sigma/k)T$. It follows that to improve the performance of a thermoelectric device the power factor should be increased as much as possible, whereas k (thermal conductivity) should be decreased as much as possible.

The ZT factor of a material indicates its thermopower conversion efficiency. Forty years ago, the best ZT factor in existence was about 0.6. After four decades of research, commercially available systems are still limited to ZT values that barely approach 1. It is widely recognized that a ZT factor greater than 1 would open the door for thermoelectric power generation to begin supplanting existing power-generating technologies, traditional home refrigerators, air conditioners, and more. Indeed, a practical thermoelectric technology with a ZT factor of even 2.0 or more will likely lead to the production of the next generation of heating and cooling systems. In view of the above, there exists a need for a method for producing practical thermoelectric technology that achieves an increased ZT factor of around 2.0 or more.

Solid-state thermoelectric coolers and thermoelectric generators in nano-structures have recently been shown to be capable of enhanced thermoelectric performance over that of corresponding thermoelectric devices in bulk form. It has been demonstrated that when certain thermoelectrically active materials (such as PbTe, $Bi_2Te_3$ and SiGe) are reduced in size to the nanometer scale (typically about 4-100 nm), the ZT factor increases dramatically. This increase in ZT has raised expectations of utilizing quantum confinement for developing practical thermoelectric generators and coolers [refrigerators]. A variety of promising approaches such as transport and confinement in nanowires and quantum dots, reduction of thermal conductivity in the direction perpendicular to superlattice planes, and optimization of ternary or quaternary chalcogenides and skutterudites have been investigated recently. However, these approaches are cost-prohibitive and many of the materials cannot be manufactured in significant amounts.

The ability to efficiently convert energy between different forms is one of the most recognizable symbols of advances in science and engineering. Conversion of thermal energy to electrical power is the hallmark of the energy economy, where even marginal improvements in efficiency and conversion methods can have enormous impact on monetary savings, energy reserves, and environmental effects. Similarly, electromechanical energy conversion lies at the heart of many modern machines. In view of the continuing quest for miniaturization of electronic circuitry, nanoscale devices can play a role in energy conversion and also in the development of cooling technology of microelectronic circuitry where a large amount of heat is generated. Accordingly, there exists a need for a broad spectrum of high performance energy conversion and thermoelectric devices, based on one-dimensional inorganic nanostructures or nanowires.

BRIEF SUMMARY OF EMBODIMENTS OF THE INVENTION

The present invention pertains to an electrical device that comprises: a fiber having a core of thermoelectric material embedded in an insulating material; and one or more conductors coupled to one of the fiber portions to induce current flow between the first and second fiber portions. The thermoelectric core has an n-doped portion and a p-doped portion.

In an embodiment, the thermoelectric core has a width substantially equivalent to a width of a single crystal of the thermoelectric material. Additionally, crystals in the thermoelectric core have substantially the same crystals orientation.

In a further embodiment, the electrical device is an FET that comprises: a second n-doped portion, wherein the p-doped portion is between the first and second n-doped portions; and an insulating layer located between the p-doped portion and the conductor.

In yet another embodiment, the electrical device is an FET that comprises: a second p-doped portion, wherein the n-doped portion is between the first and second p-doped portions; and an insulating layer located between the n-doped portion and the conductor.

In a further embodiment, the insulating material is selected from the group consisting of: pyrex; borosilcate; aluminosilicate; quartz; lead telluride-silicate; and combinations thereof. The thermoelectric material is selected from the group consisting of: $Bi_2Te_3$; SiGe; and ZnSb. Alternatively, the thermoelectric material comprises PbTe.

In yet another embodiment, the electrical device is an LED or a PV cell.

Other features and aspects of the invention will become apparent from the following detailed description, taken in conjunction with the accompanying drawings, which illustrate, by way of example, the features in accordance with embodiments of the invention. The summary is not intended to limit the scope of the invention, which is defined solely by the claims attached hereto.

BRIEF DESCRIPTION OF THE DRAWINGS

The present invention, in accordance with one or more various embodiments, is described in detail with reference to the following figures. The drawings are provided for purposes of illustration only and merely depict typical or example embodiments of the invention. These drawings are provided to facilitate the reader's understanding of the invention and shall not be considered limiting of the breadth, scope, or applicability of the invention. It should be noted that for clarity and ease of illustration these drawings are not necessarily made to scale.

Figure 1:
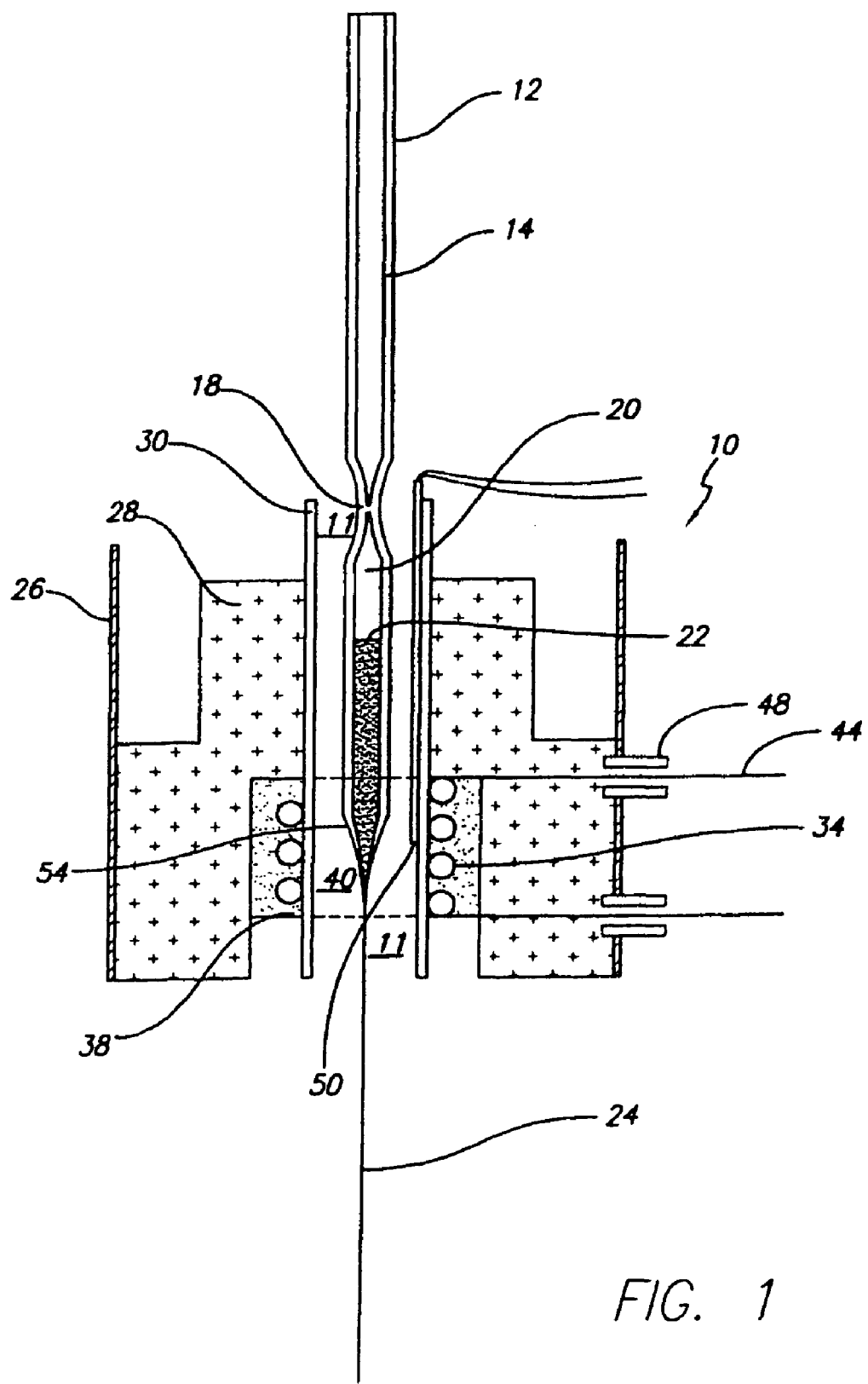
FIG. 1 is a cross-sectional view of a tubular furnace for drawing a thermoelectrically active material embedded in a glass cladding, in accordance with the principles of the present invention.

The figures are not intended to be exhaustive or to limit the invention to the precise form disclosed. It should be understood that the invention can be practiced with modification and alteration, and that the invention be limited only by the claims and the equivalents thereof.

DETAILED DESCRIPTION OF THE EMBODIMENTS OF THE INVENTION

In the following paragraphs, the present invention will be described in detail by way of example with reference to the attached drawings. Throughout this description, the preferred embodiment and examples shown should be considered as exemplars, rather than as limitations on the present invention. As used herein, the "present invention" refers to any one of the embodiments of the invention described herein, and any equivalents. Furthermore, reference to various feature(s) of the "present invention" throughout this document does not mean that all claimed embodiments or methods must include the referenced feature(s).

1.0 DEFINITIONS

Before starting a description of the Figures, some terms will now be defined.

Bulk Material: Macroscopic-sized thermoelectric materials that are typically larger than 1 micron or 1 micrometer in all three dimensions.

Chalcogenides: Group VI elements of the periodic table.

Chemical Vapor Deposition: Deposition of thin films (usually dielectrics/insulators) on wafer substrates by placing the wafers in a mixture of gases, which react at the surface of the wafers. This can be done at medium to high temperature in a furnace, or in a reactor in which the wafers are heated but the walls of the reactor are not. Plasma enhanced chemical vapor deposition avoids the need for a high temperature by exciting the reactant gases into a plasma.

Doping: Deliberately adding a very small amount of foreign substance to an otherwise very pure semiconductor crystal. These added impurities give the semiconductor an excess of conducting electrons or an excess of conducting holes (the absence of conducting electrons).

Efficiency: Efficiency is the power generated by a system divided by the power fed into it, a measure of how well a material converts one form of energy into another. Efficiency stands at a mere 8 to 12% for bulk form thermoelectric devices that are currently available or on the near horizon.

Figure of Merit: The thermoelectric figure of merit, ZT, is given by $ZT=(S2*\sigma/k)*T$, where S is the Seebeck coefficient, T is the absolute temperature, $\sigma$ is the electrical resistivity, and k is the thermal conductivity.

Lead Telluride: PbTe is one of the most commonly used thermoelectric material other than $Bi_2Te_3$. PbTe is typically used for power generation because this material exhibits its highest ZT at temperatures between 400 and 500° C. and has an effective operating range of about 200° C. around 500° C.

Nano: A prefix meaning one-billionth, or 0.000000001. For example, the wavelength of the ultraviolet light used to etch silicon chips is a few hundred nanometers. The symbol for nanometer is nm.

Quantum Confinement: Quantum Confinement takes place when carriers of electricity (electrons or holes) are confined in space by reducing the size of the conductor. For example, a very thin conducting film reduces the freedom of a carrier by limiting its freedom to propagate in a direction perpendicular to the plane of the film. The film is said to be a 2-d structure and the carrier in such a film is said to be quantum confined in one direction. It can move around in two other directions, i.e., in the plane of the film.

Seebeck Coefficient: The electromotive force generated in a material when it is subjected to a thermal gradient and is normally expressed as microvolts per Kelvin. The thermoelectric power, or Seebeck coefficient, of a material has a large role in determining its ZT factor.

Thermal Conductivity: Thermal conductivity is an inherent property of a material that specifies the amount of heat transferred through a material of unit cross-section and unit thickness for unit temperature gradient. Though thermal conductivity is an intrinsic property of a medium, it depends on the measurement temperature. The thermal conductivity of air is about 50% greater than that of water vapor, whereas the thermal conductivity of liquid water is about 25 times that of air. Thermal conductivities of solids, especially metals, are thousands of times greater than that of air.

The present invention is directed to nanostructures referred to herein as "nanowires", "cables", "arrays", "heterostructures" or "composites" that contain a plurality of one-dimensional fibers. Nanowires in accordance with the present invention generally comprise heterostructures of at least one thermoelectrically active material and one other compositionally and structurally different material (e.g., glass), wherein an interface or junction is formed therebetween. The thermoelectrically active material is reduced in thickness or diameter to nano-dimensions in order to harness the advantages of quantum confinement. In this manner, the thermoelectric efficiency of the thermoelectrically active material is enhanced. The thermoelectrically active material is also referred to herein as the "thermoelectric material". The cladding material preferably comprises a suitable glass such as a glass comprising an amorphous material having no long range ordering of its constituent atoms.

2.0 NANOWIRE

2.1 Overview

A method for producing nanowires capable of exhibiting high ZT values is described herein according to an embodiment of the present invention. The enhanced physical performance and properties of the nanowire may be on account of one or more of the following effects or properties: quantum confinement of carriers; less physical defects such as vacancies and/or dislocations; reduced grain boundaries; single crystal formation; and favorable orientation of grains. As mentioned, the equation for the thermoelectric figure of merit, Z, can be rendered dimensionless by multiplying it by an absolute temperature, T, such as the temperature of the hot junction of the thermoelectric device. It follows that the dimensionless thermoelectric figure of merit, $ZT=(S2*\sigma/k)*T$, can be used in the evaluation of the performance and energy conversion efficiency, of any thermoelectric material or device.

For nanowires of PbTe, if the bulk thermal conductivity (k) of PbTe is considered, the ZT factor at 750 K is still very high (i.e., ZT of around 2.0 or more) using $ZT=(S2*\sigma/k)*T$. ZT factors increase with temperatures between about 300 K and 750 K. For PbTe-based thermoelectric nanowires, the value of $S2*\sigma$ tends to peak at a certain level with the ZT factors increasing with decreasing nanowire width. However, after a certain nanowire width is reached, ZT factors begin to fall with decreasing nanowire width. The PbTe-based nanowires described herein may be easily tailored to exhibit n-type or p-type conduction, either by changing the stoichiometry of Pb and Te or by adding some minor components/impurities.

Numerous thermoelectric materials, including PbTe, are sensitive to oxygen, which can degrade thermoelectric performance. For this reason, it is advantageous to have such thermoelectric materials sealed off and protected from oxygen contamination within the target environment range. Of course, a thermoelectric device is not commercially viable if it cannot withstand the elements and environment it is intended to function under.

Although PbTe is the preferred thermoelectric material, other thermoelectric materials may be employed, such as $Bi_2Te_3$, SiGe, ZnSb, and $Cd_8Sb_3$, without departing from the scope of the present invention. The thermoelectric material may initially be in any convenient form, such as granules or powder.

Once fiber-drawn nanowire cables were produced using the methods described above, the electrical conductivity ($\sigma$) and thermoelectric power (S) were measured and the variation of the parameter, $S2*\sigma$, was determined. The parameter, $S2*\sigma$, is determined experimentally, multiplied by the measurement temperature (in K) and divided by the known thermal conductivity (k) to provide the ZT values of the nanowires produced by the present invention.

Testing of the glass cladding without embedded nanowires using the van der Pauw 4-probe instrument showed that the sample was very resistive such that the instrument did not measure any conductivity. Similarly, the measurement of thermopower using a conventional method (e.g. by employing the Seebeck coefficient determination system, marketed by MMR Technologies, Mountain View, Calif.) did not produce any result on account of the high resistivity of the glass cladding. However, the electrical conductivity and thermoelectric power of PbTe-embedded cables was readily measurable, indicating that the measured values of electrical conductivity and thermoelectric power are attributable to the continuous nanowires along the length of the cable.

The preferred thermoelectric material for the nanowire cables of the present invention is PbTe because of its advantageous thermoelectric properties and reasonable cost. Using the known bulk thermal conductivity value for PbTe, the calculated ZT $((S^2*\sigma/k)*T)$ factor at 750 K is >2.5. The $S2\sigma$ of PbTe exhibits a definite tendency to peak at a certain nanowire width. Given that the best known ZT factors for bulk PbTe is around 0.5, the resultant ZT factors of around 2.0 or more is considered to be significantly enhanced by one or more of quantum confinement of carriers, less physical defects such as vacancies and/or dislocations, reduced grain boundaries, single crystal formation, and favorable orientation of grains. The ZT factor increases with decreasing nanowire width until this maximum value is reached, and then the ZT factor begins to decrease with further decrease in nanowire width. As would be appreciated by those of skill in the art, other thermoelectric materials having suitable thermoelectric properties (e.g., $Bi_2Te_3$) may be employed without departing from the scope of the invention.

In accordance with the present invention, a maximum diameter of the nanowires is preferably less than approximately 200 nm, most preferably between approximately 5 nm and approximately 100 nm. In cases where the cross-section of the nanowires is not circular, the term "diameter" in this context refers to the average of the lengths of the major and minor axis of the cross-section of the nanowires, with the plane being normal to the longitudinal axis of the nanowires. Nanowires having diameters of approximately 50 nm to approximately 100 nm that may be prepared using a method of drawing of a thermoelectric material in glass cladding, as described hereinbelow.

The cables of the present invention preferably are manufactured to exhibit a high uniformity in diameter from end to end. According to some embodiments of the invention, the maximum diameter of the glass cladding may vary in a range of less than approximately 10% over the length of the cable. For less precise applications, the diameter of the nanowires may vary in a larger range (e.g., 5-500 nm, depending on the application). Electrically, the glass is preferably several orders of magnitude more resistive than the thermoelectric material it is employed to clad. The cables are generally based on a semiconducting wire, wherein the doping and composition of the wire is primarily controlled by changing the composition of the thermoelectric material to yield a wire that exhibits either p-type or an n-type thermoelectric behavior. The Cables may be used to develop superior thermoelectric devices in a cost-effective manner.

According to the invention, a method of drawing a thermoelectric material in glass cladding involves drawing the glass-clad thermoelectric material to form individual fibers (or monofibers) of thermoelectric materials, which are preferably about 500 microns in diameter or less. As would be appreciated by those of ordinary skill in the art, the monofibers may have diameters greater than 500 microns without departing from the scope of the invention. Cable diameters may be brought down to 5-100 nm by repeatedly drawing fiber bundles of monofibers, and the concentration of wires in a cross-section of the cable may be increased to $\sim 10^9/cm^2$ or greater. Such cables exhibit one or more of the following effects or properties: quantum confinement of carriers, reduced physical defects such as vacancies and/or dislocations, reduced grain boundaries, single crystal formation, and favorable orientation of grains for providing enhanced thermopower generation efficiency.

The method of drawing a thermoelectric material in glass cladding may further comprise bunching the cable together and redrawing several times in succession to produce a multi-core cable comprising glass-clad thermoelectric fibers. By way of example, the material to forming the fibers of a cable may comprise PbTe or $Bi_2Te_3$. The resulting cable comprises a multi-core cable having a plurality of individual fibers that are insulated from each other by the glass cladding. A particular glass cladding may be chosen to contain a specific composition to match the physical, chemical, thermal and mechanical properties of a selected thermoelectric material. The glass cladding is preferably several orders of magnitude higher in electrical resistivity than the metal, alloy or semiconductor material that forms the thermoelectric fibers. Suitable commercial glasses for most applications include, but are not limited to, pyrex, vycor and quartz glass.

According to a further embodiment of the invention, the metal, alloy or semiconductor material that forms the fibers is varied to render a cable either n-type or p-type, such that individual cables may be used as the n-type and p-type components of a thermoelectric device. The cables may be induced to exhibit one or more of quantum confinement, reduced physical defects, reduced grain boundaries, single crystal formation, and favorable orientation of grains by reducing the thickness or the diameter of the fibers to a predetermined range, thereby increasing the efficiency of thermopower generation.

2.2 Method of Producing Nanowires

Referring to FIG. 1, vertical tube furnace 10 is employed to provide heat for drawing glass-clad thermoelectric fibers. In particular, vertical tube furnace 10 includes a central lumen 11 for receiving a preform 12 comprising a glass tube 14 that is sealed at an area of reduced cross-section 18 to form vacuum space 20 that is at least partially filled with thermoelectric material 22. The furnace is used to melt the thermoelectric material 22 and glass tube 14 in preparation for one or more drawing operations for producing glass-clad thermoelectric fibers 24.

With further reference to FIG. 1, vertical tube furnace 10 comprises furnace shroud 26, thermal insulation 28 and muffler tube 30. Suitable materials for muffler tube 30 include conductive metals such as aluminum. Vertical tube furnace 10 further comprises one or more heater coils 34 embedded therein. More precisely, heater coils 34 are disposed between muffler tube 30 and thermal insulation 28, and refractory cement 38 is disposed between heater coils 34 and thermal insulation to direct the heat produced by heater coils 34 inwardly to form a hot zone 40 within muffler tube 30. Heater coils 34 are provided with leads 44 that may be insulated using a ceramic insulator 48. Additionally, a thermocouple probe 50 is provided for measuring the temperature within hot zone 40, which may include a length of approximately one inch.

A method of drawing a thermoelectrically active material 22 comprising an array of metal, alloy or semiconductor rods embedded in a glass cladding will now be described. Initially, a suitable thermoelectric material 22 is selected. The preferred thermoelectric material of the present invention comprises PbTe that is initially in granular form. Additional suitable thermoelectric materials include, but are not limited to, $Bi_2Te_3$, SiGe and ZnSb. The next step involves selecting a suitable material for forming the glass tubing 14. The glass material preferably is selected to have a fiber drawing temperature range that is slightly greater than the melting temperature of the thermoelectric material (e.g., $\geq 1120°$ C. for PbTe). Vertical tubular furnace 10 is then employed to seal off one end of glass tubing 14. Alternatively, a blowtorch or other heating device may be used to seal off the glass tubing 14 and create vacuum space 20.

After sealing off one end of the glass tubing 14, the next steps involve introducing the thermoelectric granules inside the vacuum space 20 and evacuating the tube by attaching the open end of the glass tube to a vacuum pump. While the vacuum pump is on, an intermediate portion of the glass tubing 14 is heated such that the glass partially melts and collapses under the vacuum. The partially melted glass tube provides an ampoule 54 containing the thermoelectric material 22 to be used in a first drawing operation. The next step involves introducing the end of ampoule 54 containing the thermoelectric material 22 into the vertical tube furnace 10. In the illustrated embodiment, the tubular furnace 10 is configured such that the ampoule 54 is introduced vertically, wherein the end of the ampoule 54 containing the thermoelectric granules is disposed within hot zone 40 adjacent to heater coils 34.

Once the ampoule 54 is properly disposed in vertical tube furnace 10, the temperature is increased such that the glass encasing the thermoelectric granules melts just enough for it to be drawn, as is done in a conventional glass draw-tower, which is per se known in the art. As discussed hereinabove, the composition of the glass is preferably chosen such that the fiber drawing temperature range is slightly greater than the melting point of the thermoelectric granules. For example, if PbTe is selected as the thermoelectric material, pyrex glass is a suitable material for drawing the glass with PbTe fibers embedded therein. The physical, mechanical and thermal properties of glass tubing 14 and thermoelectric material 22 will have a bearing on the properties of the resulting cables. Glasses exhibiting a minimal deviation of these properties with respect to those of the thermoelectric material 22 are preferably chosen as the cladding material.

The above-described glass tubing 14 may comprise commercially available pyrex tubing having a 7 mm outside diameter and a 2.75 mm inside diameter, wherein the tube is filled with PbTe granules over a length of about 3.5 inches. Evacuation of glass tubing 14 may be achieved overnight under a vacuum of approximately 30 mtorr. After evacuation, the section of glass tubing 14 containing the thermoelectric material 22 is heated gently with a torch for several minutes to remove some residual gas, and then the glass tubing 14 is sealed under vacuum above the level of thermoelectric material 22.

In operation, vertical tube furnace 10 is used for drawing the glass-clad thermoelectric fibers. Vertical tube furnace 10 includes a short hot zone 40 of about 1 inch, wherein the preform 12 is placed in the vertical tube furnace 10 with the end of the tube slightly below hot zone 40. With the furnace at about 1030° C., the weight from the lower tube end is sufficient to cause glass tubing 14 to extend under its own weight. When the lower end of glass tubing 14 appears at the lower opening of the furnace, it may be grasped with tongs for hand pulling. Preform 10 may be manually advanced periodically to replenish the preform material being used up during the fiber drawing process. Fiber 24 preferably includes a diameter between about 70 microns and about 200 microns. According to additional embodiments of the present invention, the drawing operation may be performed using an automatic draw-tower that results in very little variation in diameter.

According to further embodiments of the invention, short fiber sections may be formed by drawing the heterostructures and then breaking or cutting the heterostructures into shorter pieces. By way of example, these shorter pieces may be machined to be approximately 3 inches in length. The pieces are then bundled inside another pyrex tube, which is sealed at one end using the vertical tube furnace or using a blowtorch, as described hereinabove. When a suitable number of monofibers are packed in the tube, the open end is attached to a vacuum pump and an intermediate section is heated. This heating causes the glass tube to collapse, thereby sealing the tube and forming an ampoule for a second drawing operation, which produces a cable having a plurality of multi-core fibers. After the second drawing operation, the fibers are collected and placed in the bore of yet another sealed tube. When the bore is filled with a suitable number of monofibers, the preform is evacuated and sealed under vacuum. Fiber drawing is then performed on the twice-drawn fibers. This process is repeated as needed to obtain a final thermoelectric material diameter of about 100 nm.

2.3 Nanowire Structures and Properties

Figure 2:
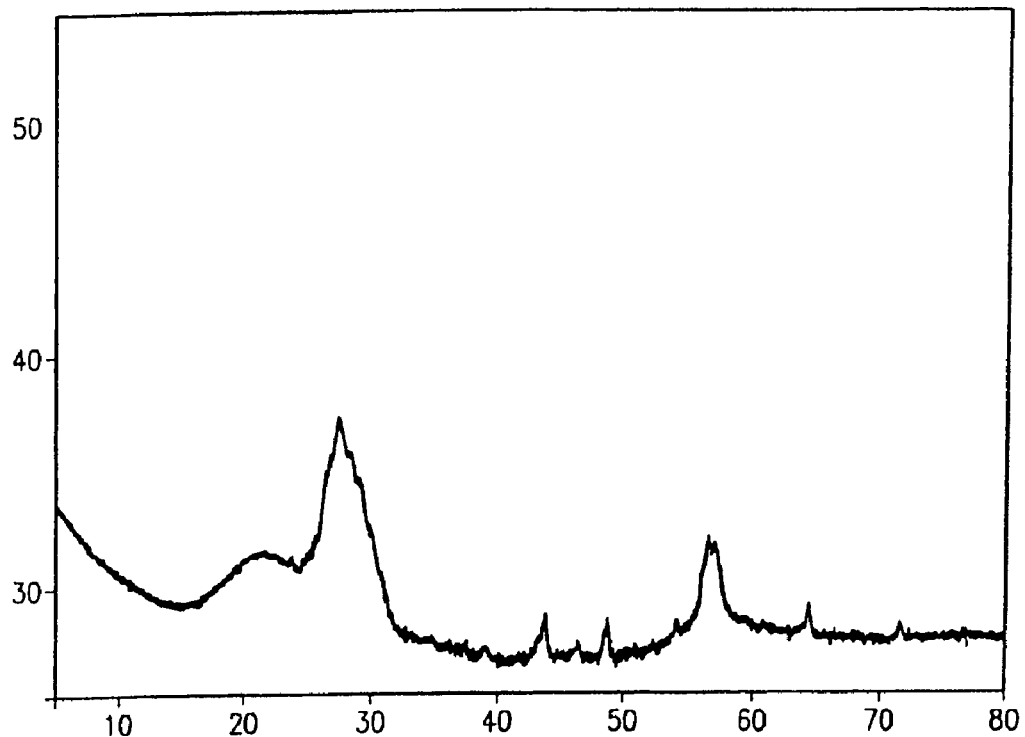
FIG. 2 is an x-ray diffraction pattern of a PbTe-based cable constructed in accordance with the principles of the invention.

In order to characterize the electronic properties of bulk and heterostructure nanowires, it is important to determine the x-ray diffraction characteristics of the glass-clad thermoelectric material. FIG. 2 depicts an x-ray diffraction pattern of a PbTe-based cable constructed in accordance with the principles of the present invention, wherein the characteristic spectrum of PbTe is overlaid on a glassy x-ray diffraction pattern. In particular, the x-ray diffraction pattern clearly indicates the presence of PbTe peaks and a lack of other peaks, thus illustrating that the glass material has neither reacted with PbTe nor devitrified during fiber drawing. These peaks are exclusively characteristic to those of PbTe crystals.

Figure 3:
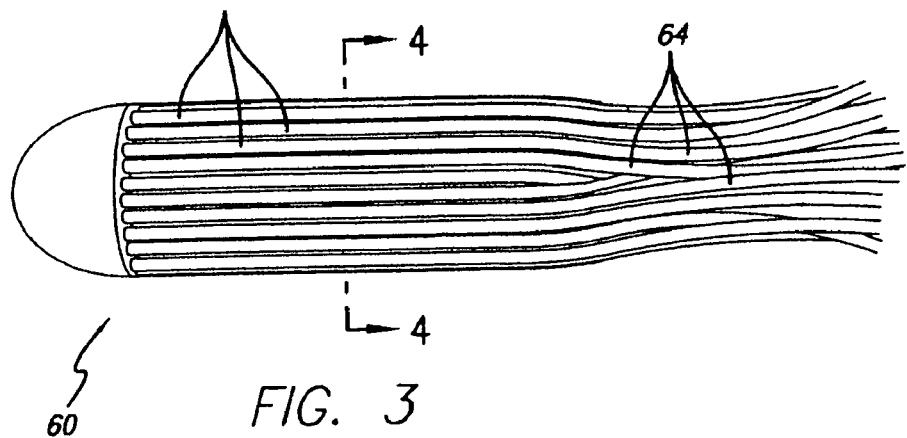
FIG. 3 is a side view of a glass-clad PbTe-based cable constructed in accordance with the principles of the invention.
Figure 4:
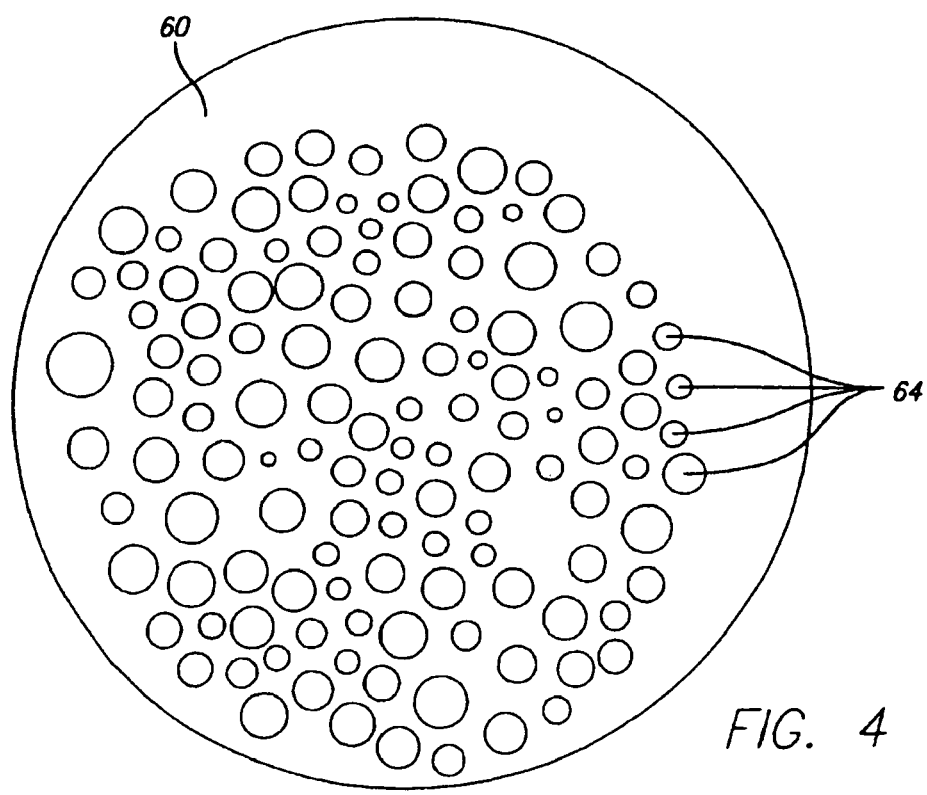
FIG. 4 is an enlarged cross-sectional view of the glass-clad PbTe-based cable of FIG. 3 taken along line 3A-3A.

FIG. 3 depicts a glass-clad PbTe-based cable 60 constructed using the method of drawing a thermoelectrically active material embedded in a glass cladding described hereinabove. Specifically, the cable 60 comprises a plurality of multiple monofibers 64 that are bundled and fused to form a cable (or button) of virtually any length. This button can be broken, cut or otherwise sectioned to produce a plurality of shorter cables having a predetermined length. FIG. 4 is an enlarged cross-sectional view of the glass-clad PbTe-based cable 60 of FIG. 3 taken along line 3A-3A. Cable 60 includes a plurality of monofibers 64, has a width of approximately 5.2 mm, and was produced using a single drawing of the PbTe fibers at a temperature of approximately 300 K.

Figure 5:
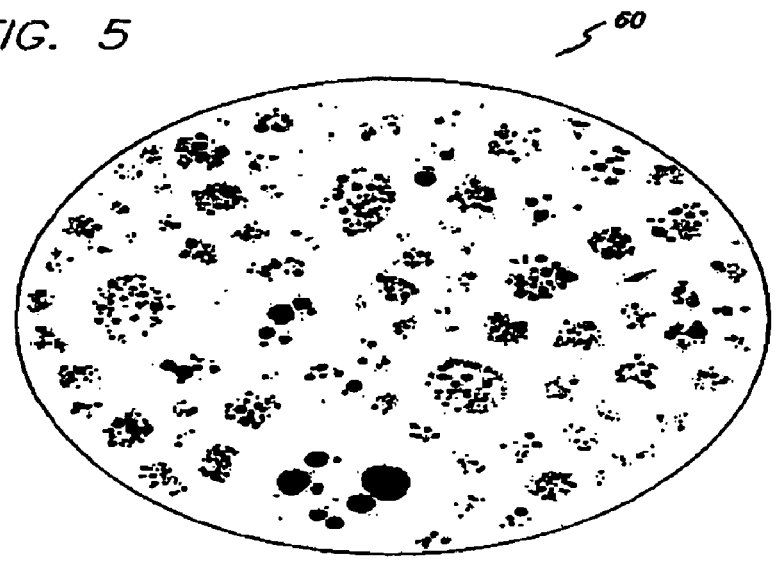
FIG. 5 is a cross-sectional view of the glass-clad PbTe-based cable of FIG. 3 after a second drawing of the PbTe fibers.
Figure 6:
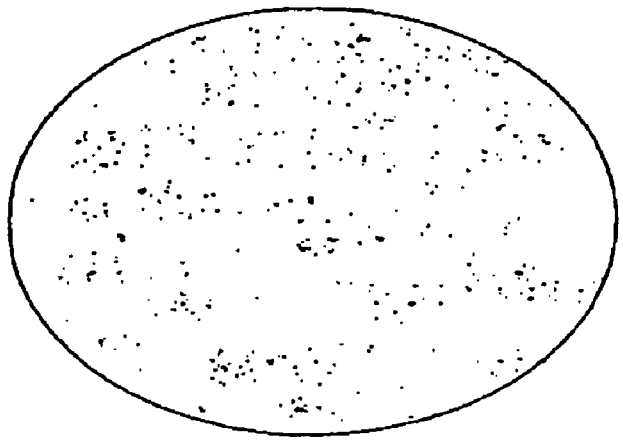
FIG. 6 is a cross-sectional view of the glass-clad PbTe-based cable of FIG. 3 after a third drawing of the PbTe fibers.

According to the preferred embodiment of the invention the cable 60 is bunched together and redrawn several times in succession to produce a multi-core cable having a plurality of individual thermoelectric fibers that are insulated from each other by the glass cladding. FIG. 5 is a cross-sectional view of the glass-clad PbTe-based cable 60 after a second drawing of the PbTe fibers. The twice-drawn cable has a width of approximately 2.78 mm. FIG. 6 is a cross-sectional view of the glass-clad PbTe based cable 60 after a third drawing of the PbTe fibers, wherein the cable has a width of approximately 2.09 mm.

A multi-core cable having a plurality of thermoelectric fibers is provided according to an embodiment of the present invention. The cable is similarly produced as cable 60. In the cable, one fiber is made with a different thermoelectric material than the material that made up of another fiber. In an embodiment, the thermoelectric fiber is made with p-doped thermoelectric material, and another thermoelectric fiber is made with n-doped thermoelectric material. Similar to cable 60, the cable is made by fusing a plurality of multiple monofibers prior to a subsequent drawing process. However, instead of using the same monofibers as with the case with cable 60, monofibers used to create the cable comprises two or more types of thermoelectric materials. For example, one strand of monofiber may be p-doped with an acceptor dopant such as boron and another monofiber may be n-doped. In this way, the cable will have a combination of n-doped and p-doped monofibers.

The cable may also be broken or sectioned to produce a plurality of shorter cables, which may be re-bundled and redrawn to produce a cable having a desired diameter.

FIGS. 3-6 illustrate the development of microstructure as the concentration of wires in the cable increases to ~109/cm2. These microstructures may be observed using optical and scanning electron microscopes. By way of example, energy dispersive spectroscopy may be employed to unambiguously indicate the presence of PbTe wires in the glass matrix.

2.4 Thermoelectric Property Characterization

An embodiment of the present invention involves the continuity and electrical connectivity of the glass embedded fibers along the entire length of the cable. Electrical connectivity is easily demonstrated by determining the resistance of the cable at different thicknesses. According to a preferred implementation of the invention, the resistance of the glass cladding, without any thermoelectric wires embedded therein, is about 7 to 8 orders of magnitude higher than that of the continuous thermoelectric fibers.

Figure 7:
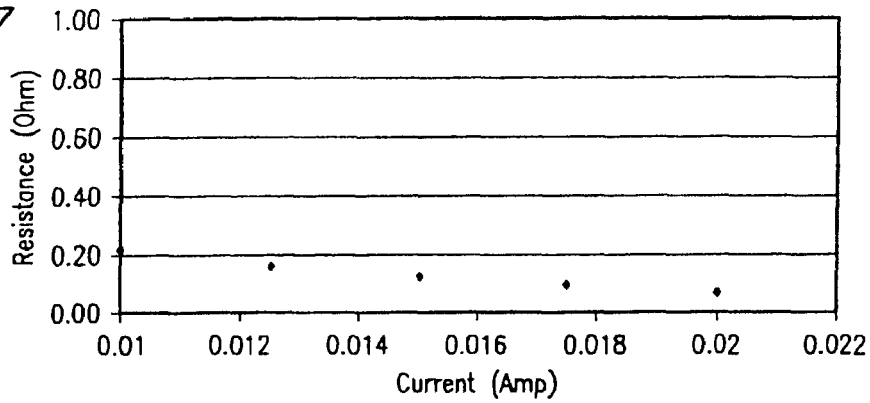
FIG. 7 is a chart illustrating the DC resistance of the PbTe cable of FIG. 4 (after a first drawing of the PbTe fibers)
Figure 8:
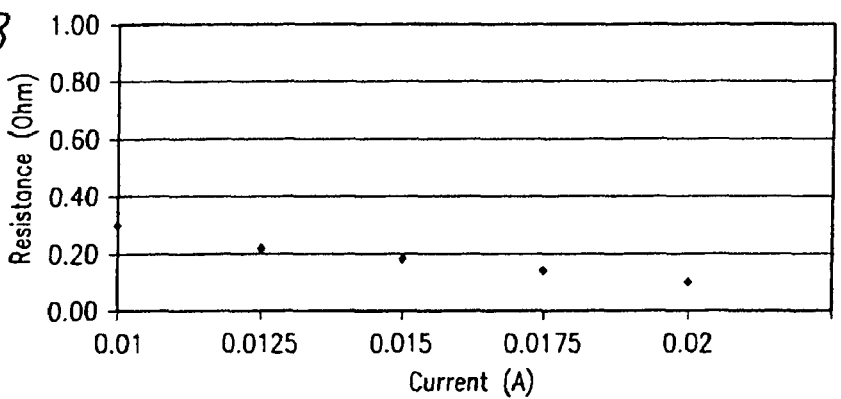
FIG. 8 is a chart illustrating the DC resistance of a PbTe cable of FIG. 5 (after a second drawing of the PbTe fibers)
Figure 9:
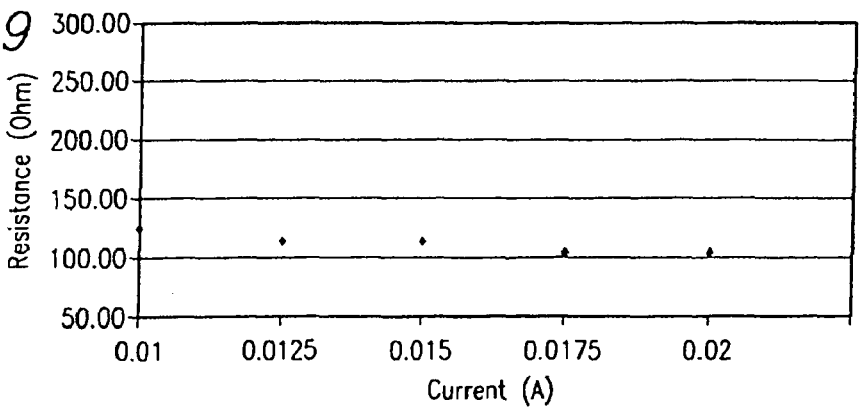
FIG. 9 is a chart illustrating the DC resistance of a PbTe cable of FIG. 6 (after a third drawing of the PbTe fibers)

The samples used to determine electrical connectivity of the thermoelectric wires are in the form of "buttons" of PbTe prepared from the preforms following the one of the fiber drawing steps. Referring to FIGS. 7-9, the resistance of the thermoelectric wires embedded in the glass is approximately 1 ohm or less. On the other hand, the resistance of the glass cladding without thermoelectric wires is more than 108 ohms, which is about 8 orders of magnitude higher than that of the PbTe-embedded cables. This difference in electrical resistance indicates that the glass-clad thermoelectric wires drawn using the methods described herein exhibit electrical connectivity from one end to the other.

FIG. 7 is a chart illustrating the DC resistance of PbTe cable 60 after the first drawing of the PbTe fibers, wherein the resistance of the cable (Ohms) is plotted against the electrical current (amps). In particular, the DC resistance of the cable 60 steadily decreases with an increasing current. FIG. 8 is a chart illustrating the DC resistance of the cable 60 after the second drawing of the PbTe fibers, while FIG. 9 is a chart illustrating the DC resistance of the PbTe cable 60 after the third drawing of the PbTe fibers.

A preferred cable produced in accordance with the principles of the present invention preferably comprises at least one thermoelectric fiber embedded in an electrically insulating material, wherein the thermoelectric material exhibits one or more of quantum confinement of carriers, reduced physical defects such as vacancies and/or dislocations, reduced grain boundaries, single crystal formation, and favorable orientation of grains. According to the preferred embodiment of the invention, a width of each fiber is substantially equivalent to a width of a single crystal of the thermoelectric material, wherein each fiber has substantially the same crystal orientation. The preferred cable comprises a plurality of fibers that are fused or sintered together such that there is electrical connectivity between all the fibers. Alternatively, there is electrical connectivity between some, but not all of, the fibers of the cable.

The glass cladding for the cable preferably comprises an electrically insulating material comprising a binary, ternary or higher component glass structure such as pyrex, borosilcate, aluminosilicate, quartz, and lead telluride-silicate. The thermoelectric material may be chosen from the group consisting of a metal, a semi-metal, an alloy and a semiconductor, such that the thermoelectric material exhibits electrical connectivity and one or more of quantum confinement of carriers, reduced physical defects such as vacancies and/or dislocations, reduced grain boundaries, single crystal formation, and favorable orientation of grains along a predetermined length of cable from several nanometers to kilometers. The ZT factor of the cable is preferably at least 0.5, more preferably at least 1.5, most preferably at least 2.5.

3.0 APPLICATIONS OF NANOWIRE 3.1 Overview of Photolithography Based Devices

Figure 10:
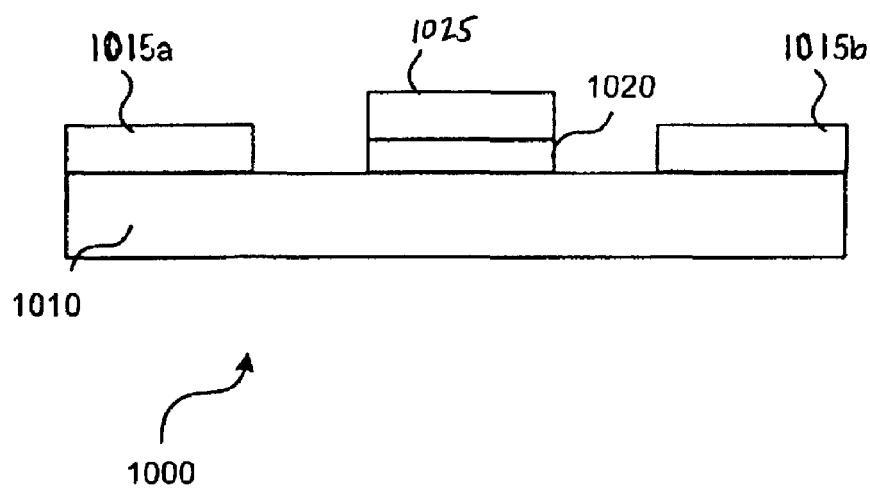
FIG. 10 illustrates a conventional metal oxide field effect transistor (MOSFET)
Figure 11:
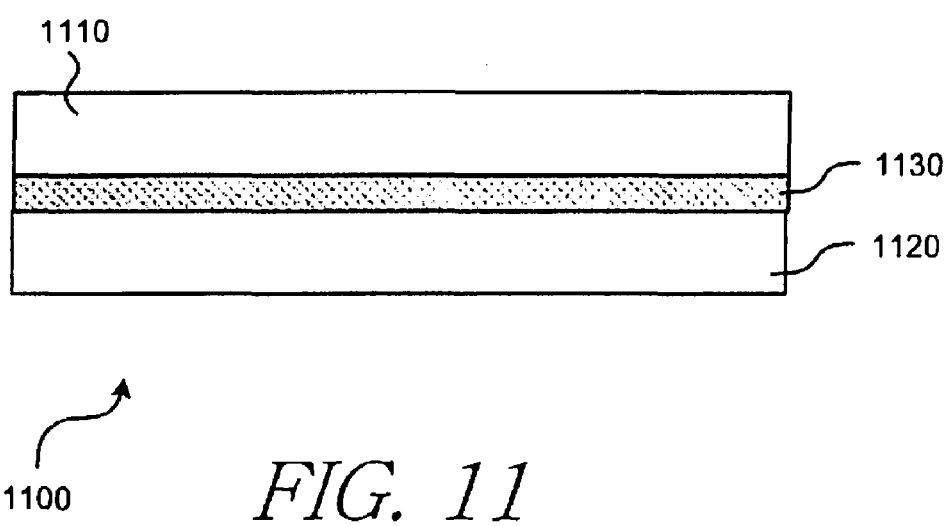
FIG. 11 illustrates a conventional diode.

Conventional semiconductor devices such as field-effect-transistors (FETs), diodes and light-emitting diodes (LEDs), and photovoltaic cells are typically manufactured using purely a photolithography process. FIGS. 10 and 11 illustrate two of such devices produced with a photolithography process. FIG. 10 illustrates a metal-oxide semiconductor FET (MOSFET) 1000. MOSFET 1000 is a N channel MOSFET that includes a P type well layer 1010 formed on a substrate (not shown). P type well layer 1010 is created by doping a previously charge-neutral semiconductor material with a P-type dopant. Once well layer 1010 is formed, the two N-doped wells 1015a and 1015b are created. Wells 1015a-b are created by masking the surface of layer 1010 and leaving the surface area where N wells 1015a-b will be located unmasked. MOSFET 1000 also includes an insulating layer 1020, and a gate 1025.

Gate 1025 may be made from metal or polysilicon (doped silicon), or other suitable material. Insulating layer 1020 is typically made from an oxide material. In MOSFET 1000, gate 1025 induces conduction between the two N regions 1015a and 1015b with the present its electric field. This typically occurs when the voltage at the gate is 0.6V above the source.

FIG. 11 illustrates a semiconductor diode 1100, which is a simple sandwich of two layers of different materials. Diode 1100 includes a n-doped layer 1110 and a p-doped layer 1120. Layers 1110 and 1120 are mated to form diode 1100. In a neutral state, layers 1110 and 1120 forms depletion zone 1130, which is caused by the migration of electrons and holes from layer 1110 and layer 1120, respectively. Depletion zone 1130 is neutral in charge. In an unbiased state, diode 1100 does not conduct current due to the present of depletion zone 1130. In a forward bias mode, diode 1100 allows electrons to flow from layer 1110 to layer 1120 and holes to flow from layer 1120 to layer 1110. Diode 1100 is in a forward bias mode when layer 1110 is made more negative than layer 1120. Conversely, diode 1100 is in a reverse bias mode when layer 1110 is made more positive than layer 1120. Current does not flow when diode 1100 is reverse biased.

Typically, optoelectronics devices such as LEDs are also made with similar lithographic processes. As will now be described, these common devices (e.g., FETs, bi-polar transistors, diodes, LEDs, and logic gates) can be made using nanowires produced using methods in accordance with various embodiments of the present invention.

3.2 Nanowire FETs

Figure 12:
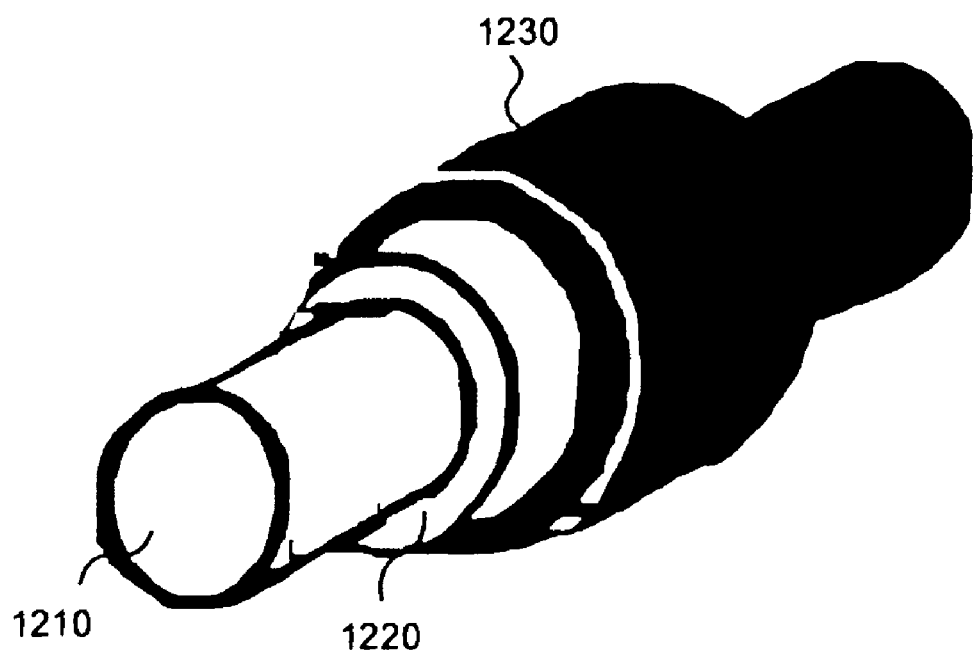
FIGS. 12-13 illustrate exemplary nanowire MOSFETs according to embodiments of the present invention.

FIG. 12 illustrates an FET 1200 according to an embodiment of the present invention. FET 1200 includes a cable 1210, an oxide layer 1220, and a gate layer 1230. In producing FET 1200, cable 1210 can take the form of cable 60 (FIG. 3) or cable 65 (FIG. 6). As previously described, cable 60 is created using a plurality of monofibers 64 that are bundled together and then redrawn singly or multiple times until a desired diameter is reached. The plurality of monofibers 64 in cable 60 are composed of the same thermoelectric material such as a n-doped material or a p-doped material. In FET 1000, the middle portion of cable 1210 is p-doped and the two ends are n-doped. Gate 1230 is positioned such that it is located over the p-doped portion of cable 1210. In this way, an n-channel inversion layer is created in the middle portion of cable 1210 when gate 1230 is biased.

In FET 1200, oxide layer 1220 encompasses cable 1210. Oxide layer 1020 acts as an insulating layer between cable 1210 and gate layer 1230. In an embodiment, oxide layer 1220 is optional and is not required in creating FET 1200. In this embodiment, the glass cladding of cable 1010 can be made of an oxide composite material such as glass having lead oxide, tellurium dioxide, silicon dioxide or other suitable insulating materials.

Similar to gate 825, gate layer 1230 may be made from metal, polysilicon, or other suitable material. Gate layer 1230 may be created using a coating process after the creation of cable 1210 and oxide layer 1220. Gate layer 1230 may also be a prefabricated hollow cylinder whereby cable 1210 may be inserted therein. Alternatively, cable 1210, oxide layer 1220, and layer 1230 can be produced simultaneously using a drawing process.

In an alternative embodiment of the present invention, cable 1210 of FET 1200 comprises a single monofiber of thermoelectric material, similar to monofiber 64 (FIG. 3). In this embodiment, the glass cladding that surrounds the single monofiber also acts as the insulating oxide layer. The drain and source are then created by introducing n or p dopants or impurities to each end of cable 1210. N-type dopant is introduced if cable 1210 is produced with p-type thermoelectric materials, whereas p-type dopant is introduced if cable 1210 is produced with n-type materials. In this way, the middle portion of cable 1210 has the opposite thermoelectric composition than the two ends of cable 1210. To complete the FET, gate layer 1230 is disposed on top of the middle portion of cable 1210.

Figure 13:
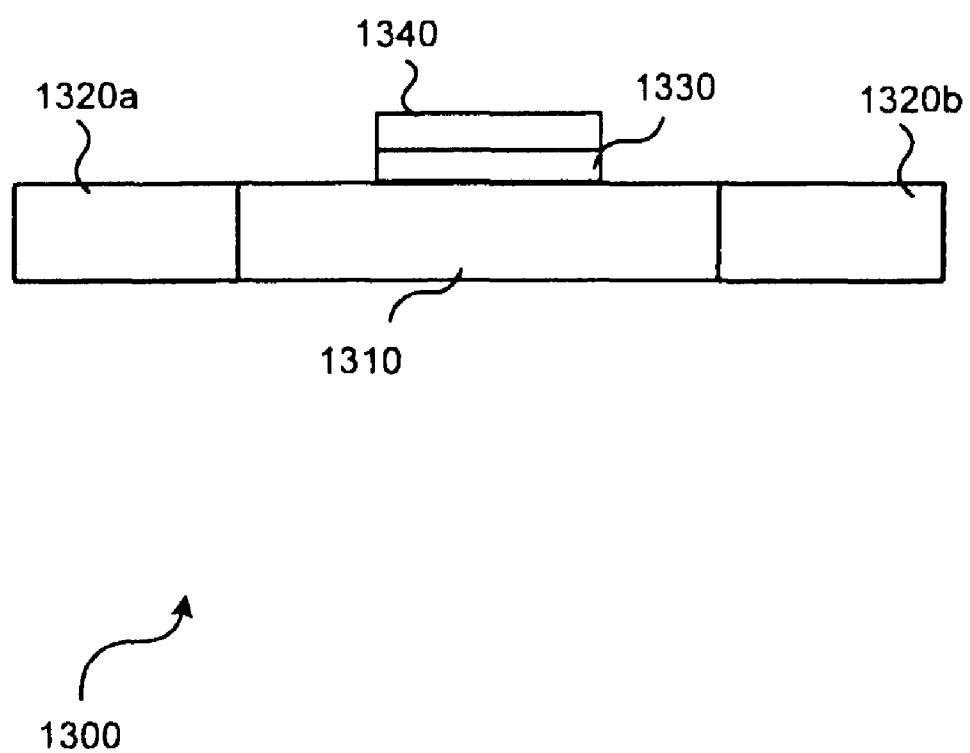

FIG. 13 illustrates another FET 1300 according to an embodiment of the present invention. FET 1300 includes a fiber 1310, doped portions 1320a and 1320b, an oxide layer 1330, and a gate 1340. Fiber 1310 is a single thermoelectric glass clad fiber, similar to monofiber 64. In an alternative embodiment, fiber 1310 is a bundle of thermoelectric fibers similar to cable 60.

In FET 1300, fiber 1110 is made of p-doped thermoelectric materials. To create the source and drain of the FET, each end of fiber 1310 is doped with n-type dopants. N-doped portion 1320a acts as a gate, and N-doped portion 1320b acts as a drain. Portions 1320a and 1320b remain separated by the middle portion of fiber 1310, which remains p-doped.

Oxide layer 1330 is the glass cladding of fiber 1310. As shown, oxide layer 1330 is removed at each end of fiber 1310, but left intact in the middle to provide a barrier between the gate and fiber 1310. The glass cladding layer above portions 1320a-b may be removed through an etching process. To complete FET 1300, gate 1340 is deposited on top of oxide layer 1330.

In an alternative embodiment of the present invention, cable 1310 is n-doped and portions 1320a-b are p-doped. In this embodiment, a p-channel enhancement MOSFET is produced.

3.3 Nanowire LEDs and Photovoltaic (PV) Cells

In general, all LEDs emit electromagnetic radiation. Whether the radiation is in the form of visible light depends on the frequency of the electromagnetic radiation. In its simplest form, LED is p-n junction diode. In general, radiation is produced when free electrons move to from a n-doped region to a p-doped region. This is called the recombination process. During the recombination process, electrons release energy in the form of photons or electromagnetic radiations whenever they fall from a higher energy orbit to a lower energy orbit. However, most LEDs emit an invisible radiation. To make this radiation visible, it is necessary to experiment with material make up of the semiconductor layers and also with the band gap of the semiconductor materials. The band gap of the semiconductor materials determines the frequency of the emitted radiation as electrons fall to a lower orbit.

For LED applications, monofibers (e.g., monofiber 64 of FIG. 3) can made with semiconductor materials having a wide band gap such as gallium phosphide, gallium arsenide phosephide, gallium nitrite, indium gallium nitrite, or other suitable semiconductor materials.

Figure 14:
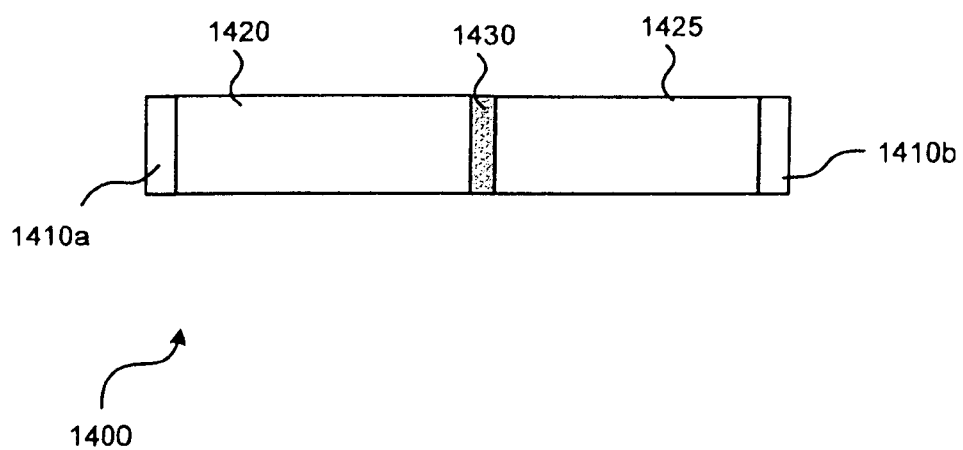
FIG. 14 illustrates an exemplary nanowire diode according to an embodiment of the present invention.

FIG. 14 illustrates an exemplary LED 1400 made with nanowire according to an embodiment of the present invention. LED 1400 includes ohmic contacts 1410a-b and cable portions 1420 and 1425. Ohmic contact 1410a is disposed on one end of cable portion 1420 such that it makes electrical contact with a plurality of monofibers 64 within cable portion 1420. In an embodiment, cable portion 1420 contains n-doped monofibers, and cable portion 1425 contains p-doped monofibers. Cable portion 1420 and cable portion 1425 are fused together at junction 1430, which forms one or more p-n junctions at junction 1430. To complete the LED, another ohmic contact 1410b is provided at the end of cable portion 1425. Once the circuit is completed by electrically coupling ohmic contacts 1410a and 1410b, electrons may migrate from cable portion 1420 to cable portion 65, or vice versa, and produce light as a by-product. Cable portions 1420 and 1425 may be made using a process similar to that described with respect to FIGS. 3-6.

Figure 15:
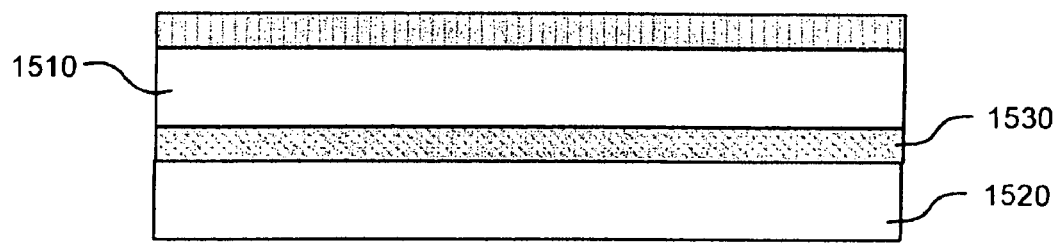
FIG. 15 illustrates an exemplary nanowire photovoltaic cell according to an embodiment of the present invention.

FIG. 15 illustrates a nanowire PV cell 1500 according to an embodiment of the present invention. PV cell 1500 includes cable portions 1510 and 1520. Cable portion 1510 is made from n-type thermoelectric material, and cable portion 1520 is made from p-type materials. Both cable portions 1510 and 1520 are manufactured using processes similar to the manufacturing processes with respect to FIGS. 3-6. Similar to a diode, portion 1530 forms neutral state 1530 where there is no current flow. However, when cable portion 1510 is energized by photons, neutral state 1530 is disrupted. In the disrupted state, electrons from portion 1510 are induced to migrate to portion 1520 so equilibrium may be reached. To complete the PV cell, an external current path is provided between portions 1510 and 1520.

Thus, it is seen that a thermoelectric device with enhanced physical performance and properties may be on account of one or more of the following properties or effects: quantum confinement of carriers, less physical defects such as vacancies and/or dislocations, grain boundaries is reduced or eliminated, single crystal formation, and favorable orientation of grains. One skilled in the art will appreciate that the present invention can be practiced by other than the various embodiments and preferred embodiments, which are presented in this description for purposes of illustration and not of limitation, and the present invention is limited only by the claims that follow. It is noted that equivalents for the particular embodiments discussed in this description may practice the invention as well.

While various embodiments of the present invention have been described above, it should be understood that they have been presented by way of example only, and not of limitation. Likewise, the various diagrams may depict an example architectural or other configuration for the invention, which is done to aid in understanding the features and functionality that may be included in the invention. The invention is not restricted to the illustrated example architectures or configurations, but the desired features may be implemented using a variety of alternative architectures and configurations. Indeed, it will be apparent to one of skill in the art how alternative functional, logical or physical partitioning and configurations may be implemented to implement the desired features of the present invention. Also, a multitude of different constituent module names other than those depicted herein may be applied to the various partitions. Additionally, with regard to flow diagrams, operational descriptions and method claims, the order in which the steps are presented herein shall not mandate that various embodiments be implemented to perform the recited functionality in the same order unless the context dictates otherwise.

Although the invention is described above in terms of various exemplary embodiments and implementations, it should be understood that the various features, aspects and functionality described in one or more of the individual embodiments are not limited in their applicability to the particular embodiment with which they are described, but instead may be applied, alone or in various combinations, to one or more of the other embodiments of the invention, whether or not such embodiments are described and whether or not such features are presented as being a part of a described embodiment. Thus the breadth and scope of the present invention should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

A group of items linked with the conjunction "and" should not be read as requiring that each and every one of those items be present in the grouping, but rather should be read as "and/or" unless expressly stated otherwise. Similarly, a group of items linked with the conjunction "or" should not be read as requiring mutual exclusivity among that group, but rather should also be read as "and/or" unless expressly stated otherwise. Furthermore, although items, elements or components of the invention may be described or claimed in the singular, the plural is contemplated to be within the scope thereof unless limitation to the singular is explicitly stated.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, may be combined in a single package or separately maintained and may further be distributed across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives may be implemented without confinement to the illustrated examples. For example, block diagrams and their accompanying description should not be construed as mandating a particular architecture or configuration.

The invention claimed is:

1. A field effect transistor device, comprising:
   at least one semiconductor fiber comprising a channel region of a first conductivity type located between a source region and a drain region of a second conductivity type;
   a glass gate insulating layer located on the channel region; and
   a gate electrode located adjacent to the glass gate insulating layer, wherein the glass gate insulating layer surrounds the channel region in the at least one semiconductor fiber and the gate electrode comprises a cylinder which surrounds the glass gate insulating layer.

2. The device of claim 1, wherein an inversion region is created in the channel region when the gate electrode is biased.

3. The device of claim 1, wherein the glass comprises pyrex glass, vycor glass, borosilcate glass, aluminosilicate glass, quartz glass, lead telluride-silicate glass, silicon oxide glass, lead oxide glass, tellurium dioxide glass, or combinations thereof.

4. The device of claim 1, wherein the at least one semiconductor fiber comprises a single fiber and the entire channel region of the transistor is located in the single fiber.

5. The device of claim 1, wherein the at least one semiconductor fiber comprises a cable containing a plurality of glass clad semiconductor fibers and the channel region of the transistor is located in the plurality of glass clad semiconductor fibers.

6. The device of claim 1, wherein the source region and the drain region are not covered by the glass gate insulating layer.

7. The device of claim 1, further comprising a first conductor coupled to the source region and a second conductor coupled to the drain region.

8. A field effect transistor device, comprising:
   at least one semiconductor fiber comprising a channel region of a first conductivity type located between a source region and a drain region of a second conductivity type;
   a glass gate insulating layer located on the channel region; and
   a gate electrode located adjacent to the glass gate insulating layer,
   wherein the at least one semiconductor fiber comprises a single fiber and the entire channel region of the transistor is located in the single fiber.

9. The device of claim 8, wherein an inversion region is created in the channel region when the gate electrode is biased.

10. The device of claim 8, wherein the glass comprises pyrex glass, vycor glass, borosilcate glass, aluminosilicate glass, quartz glass, lead telluride-silicate glass, silicon oxide glass, lead oxide glass, tellurium dioxide glass, or combinations thereof.

11. The device of claim 8, wherein the glass gate insulating layer is located over only one side of the channel region in the at least one semiconductor fiber and the gate electrode is located over glass gate insulating layer.

12. The device of claim 8, wherein the source region and the drain region are not covered by the glass gate insulating layer.

13. The device of claim 8, further comprising a first conductor coupled to the source region and a second conductor coupled to the drain region.

14. A field effect transistor device, comprising:
- at least one semiconductor fiber comprising a channel region of a first conductivity type located between a source region and a drain region of a second conductivity type;
- a glass gate insulating layer located on the channel region; and
- a gate electrode located adjacent to the glass gate insulating layer,
- wherein the at least one semiconductor fiber comprises a cable containing a plurality of glass clad semiconductor fibers and the channel region of the transistor is located in the plurality of glass clad semiconductor fibers.

15. The device of claim 14, wherein an inversion region is created in the channel region when the gate electrode is biased.

16. The device of claim 14, wherein the glass comprises pyrex glass, vycor glass, borosilcate glass, aluminosilicate glass, quartz glass, lead telluride-silicate glass, silicon oxide glass, lead oxide glass, tellurium dioxide glass, or combinations thereof.

17. The device of claim 14, wherein the glass gate insulating layer is located over only one side of the channel region in the at least one semiconductor fiber and the gate electrode is located over glass gate insulating layer.

18. The device of claim 14, wherein the source region and the drain region are not covered by the glass gate insulating layer.

19. The device of claim 14, further comprising a first conductor coupled to the source region and a second conductor coupled to the drain region.

* * * * *